US006291843B1

(12) United States Patent
Sugawara

(10) Patent No.: US 6,291,843 B1
(45) Date of Patent: Sep. 18, 2001

(54) SEMICONDUCTOR MEMORY DEVICE

(75) Inventor: Hiroshi Sugawara, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/376,362

(22) Filed: Aug. 18, 1999

(30) Foreign Application Priority Data

Aug. 18, 1998 (JP) .................................................. 10-232156

(51) Int. Cl.[7] .................................................. H01L 27/10
(52) U.S. Cl. .................. 257/208; 257/202; 257/203; 257/204; 257/206; 257/208; 257/209; 257/314; 257/909; 438/129
(58) Field of Search .................................... 257/202, 203, 257/204, 206, 208, 209, 909, 314; 438/129

(56) References Cited

U.S. PATENT DOCUMENTS 5,506,428 * 4/1996 Inoue et al. ........................... 257/208
5,763,908 * 6/1998 Han et al. ............................ 257/208

FOREIGN PATENT DOCUMENTS

| 6-283721 | 10/1994 | (JP) . |
| 08-32035 | 2/1996 | (JP) . |
| 08-204158 | 8/1996 | (JP) . |
| 10-50965 | 2/1998 | (JP) . |

* cited by examiner

Primary Examiner—Eddie Lee
Assistant Examiner—Edgardo Ortiz
(74) Attorney, Agent, or Firm—Sughrue, Mion, Zinn, Macpeak & Seas, PLLC

(57) ABSTRACT

A semiconductor memory device improves driving capability of bit select transistors without increasing a memory cell array in size, wherein first and second sub-bit lines are elongated along the direction of a bit line and in the reverse direction and are connected to a main bit line through first and second bit select transistors each being independently controllable and the first and second bit select transistors are disposed in a deviated manner without being adjacent to each other with respect to the direction of the bit line.

14 Claims, 8 Drawing Sheets

SEMICONDUCTOR MEMORY DEVICE

BACKGROUND OF THE INVENTION

1. Field of the Invention

The present invention relates to a semiconductor memory device and more particularly to a semiconductor memory device being capable of holding stored information even if power is shut off.

2. Description of the Related Art

A semiconductor memory device is roughly classified into two categories; so-called a volatile memory in which stored information is erased when power is shut off and also so-called a nonvolatile memory in which stored information is held even when the power is shut off. The former is known as a RAM (Random Access Memory) and the latter as a ROM (Read Only Memory). The ROM, in particular, is employed in a variety of information processing devices thanks to its non-volatility. Of the ROMs, an EPROM (Erasable and Programmable ROM) in which information written once can be erased by the radiation of ultraviolet rays and can be electrically written and/or an EEPROM (Electrically Erasable and Programmable ROM) in which information written once can be electrically erased and can be rewritten are widely used. In particular, the EPROM in which information can be batch-erased and written in bytes is known as a flash memory. This has become a focus of attention as a possible alternative to a floppy disk and/or hard disk which are conventionally typical of a storage medium.

The nonvolatile semiconductor memory device has a MIS (Metal Insulator Semiconductor) type structure. Its metal gate has a stacked structure composed of a floating gate embedded in an insulating film and of a control gate disposed on an insulating body above the floating gate.

To store information in the semiconductor memory device, a comparatively high positive voltage of about 12V is applied between the control gate and a source and a positive voltage of about 6V is applied between the source and a drain to generate a hot electron in an electron flowing from the source to the drain and, by utilizing an F-N (Fowler-Nordheim) tunnel mechanism, to inject the hot electron into the floating gate for charging.

On the other hand, to erase stored information, the F-N tunnel mechanism is again used to discharge electrons from the floating gate. That is, the control gate is grounded or negatively biased to be −8V while the source is positively biased to be 12 to 8V to erase information through the source. As an alternative method, the control gate is negatively biased and the semiconductor substrate is positively biased to erase information through a channel.

Accordingly, since a threshold voltage of a MIS-type transistor differs depending on the existence or absence of electrons at the floating gate, information can be read by detecting the amount of change of the threshold voltage.

FIG. 6 is a top view showing one example of an approximate layout of a conventional semiconductor memory device. The conventional semiconductor memory device has a plurality of unit assemblies 52 containing more than one memory cell (MC) 51, which is surrounded by a broken line in the drawing, disposed in a matrix-like manner in the directions of a word line (X) and of a bit line (Y).

The memory cell 51 has a nonvolatile MIS-type structure with a floating gate and a control gate. The reference number 53a is a first main source line (MSL1), 53b being a second main source line (MSL2), 54a being a first main bit line (MBL1), 54b being a second main bit line (MBL2), 55a being a first sub-source line (SSL1), 55b being a second sub-source line (SSL2), 56a is a first sub-bit line (SBL1), 56b is a second sub-bit line (SBL2), 57a being a first source select transistor (TSS1), 57b being a second source select transistor (TSS2), 58a being a first bit select transistor (TSB1), 58b being a second bit select transistor (TSB2), 59a being a first source contact (CS1), 59b being a second source contact (CS2), 60a being a first bit contact (CB1) and 60b being a second bit contact (CB2).

The first and second main source lines 53a and 53b, and the first and second main bit lines 54a and 54b are all composed of metal wiring made of aluminum or the like. The first and second sub-source lines 55a and 55b, and the first and second sub-bit lines 56a and 56b are composed of diffused layers formed on a semiconductor substrate. The first and second source select transistors 57a and 57b, the first and second bit select transistors 58a and 58b are composed of conventional MIS-type transistors. The first and second source contact 59a and 59b, and the first and second bit contacts 60a and 60b are formed in a contact hole being opened through an insulating film, which serve to make the metal wiring contact to the diffused layer.

The first and second source select transistors 57a and 57b are adapted to independently control the first and second source line 55a and 55b in order to write, delete and read information. Similarly, the first and second bit select transistors 58a and 59b are adapted to independently control the first and second sub-bit line 56a and 56b in order to write, delete and write information as well.

As depicted in FIG. 6, the unit assembly 52 is so configured that two groups of memory cells 51 consisting one group (first group) having two or more memory cells connected in parallel between the first sub-source line 55a and the first sub-bit line 56a and the other group (second group) having two or more memory cells connected in parallel between the second sub-source line 55b and the second sub-bit line 56b are disposed in a manner that an isolated area 61 is located between these two groups of memory cells.

The first and second sub-bit lines 56a and 56b are elongated along the direction of the bit line (Y) and in one direction (in the downward direction in this example) and are connected to the first and second main bit lines 54a and 54b through the first and second bit contacts 60a and 60b.

On the other hand, the first and second sub-source lines 55a and 55b are elongated along the direction of the bit line and in the other direction (in the upward direction in this example) and are connected to the first and second main source lines 53a and 53b through the first and second source select transistors 57a and 57b and further through the first and second source contacts 59a and 59b. A plurality of unit assemblies 52 described above is disposed in a mirror-image manner in upward and downward as well as right and left places to construct one memory array.

In the conventional semiconductor memory device as shown in FIG. 6, since the first and second bit select transistors 58a and 58b are so disposed that they are adjacent to each other, their sizes are limited from the viewpoint of space. It is, therefore, impossible to make these transistors 58a and 58b larger in size, thus making it difficult to improve their driving capability.

This means that, if all wiring pitches are provided in accordance with the minimum design standard F, the designing is subject to the constraint that these two bit select transistors 58a and 58b must be disposed within an area 6F from the viewpoint of design rules. Moreover, if the bit select transistors 58a and 58b are made larger in size in an attempt to improve their driving capability, the area of the unit assembly 52 increases, as a result, making the whole memory cell array larger in size. The conventional semiconductor memory device has another shortcoming that, due to the use of the metal wiring, a pitch is severely tight in the wiring for the first and second sub-source lines 55a and 55b, and the first and second sub-bit lines 56a and 56b.

A semiconductor memory device which has overcome the above shortcoming is disclosed, for example, in Japanese Patent Application Laid-open Hei 6-283721. FIG. 7 is a top view showing another example of an approximate layout of the semiconductor memory device shown in the above application. FIG. 8 is a top view showing a wiring pattern of the semiconductor device. The semiconductor memory device disclosed in this application differs greatly from that shown in FIG. 6 in that a main source line (MSL) 62 is disposed in the direction of a word line (X) without the use of the first and second main source lines 53a and 53b as shown in FIG. 6 in an approximately same manner as for the wiring of diffused layers in first and second sub-source lines 55a and 55b (or first and second sub-bit lines 56a and 56b). This main source line 62 is connected to the first and second sub-source lines 55a and 55b at the end of an array. This configuration can provide sufficient space to place the first and second bit select transistors 58a and 58b because there is no need to mount the first and second main source lines 53a and 53b, thus allowing the transistors 58a and 58b being larger in size to be mounted.

However, there is another problem in the above conventional semiconductor memory device as disclosed in the application. That is, since the resistance of the first and second sub-bit lines has become high in the structure of the semiconductor memory device disclosed in the above application, the swinging in the potential of the first and second sub-source lines is large. This high resistance of the first and second sub-bit lines is attributable to the wiring constructed by diffused layers. Accordingly, the high resistance causes swinging in the potential of the first and second sub-source lines 55a and 55b. As a result, this leads to inexact operations of the semiconductor memory device when information is to be written, deleted and read out, thus reducing reliability of the memory device.

SUMMARY OF THE INVENTION

In view of the above, it is an object of the present invention to provide a semiconductor memory device which can improve driving capability of the bit select transistors without increasing a memory cell array in size.

According to an aspect of the present invention, there is provided a semiconductor memory device comprising more than one unit assembly wherein first and second main source lines are disposed respectively on both sides of a main bit line and first and second sub-source lines connected respectively to the first and second main source lines and first and second sub-bit lines connected to said main bit line are provided and wherein two groups of memory cells consisting one group having two or more memory cells connected in parallel between the first sub-source line and the first sub-bit line and the other group having two or more memory cells connected in parallel between the second sub-source line and the second sub-bit line are disposed in a manner that an isolated area is located between these two groups of memory cells.

whereby each of the first and second bit lines is elongated along the direction of the bit line and in the reverse direction and is connected to the main bit line through first and second bit select transistors each being independently controllable.

In the foregoing, a preferable mode is one wherein the first and second sub-bit lines are connected to the main bit line through first and second bit contacts connected respectively to the first and second bit select transistors.

Also, a preferable mode is one wherein the first and second sub-source lines are connected directly, not through source select transistors, to the first and second main source lines.

Also, a preferable mode is one wherein the first and second source lines are connected respectively to the first and second main source lines through first and second source contacts disposed, centering on said main bit line, in a directly opposite position to each other in each unit assembly.

Also, a preferable mode is one wherein both the main bit line and the first and second main source lines are composed of first metal wiring formed simultaneously.

Also, a preferable mode is one wherein the first and second source lines are composed of the first metal wiring formed simultaneously while the main bit line is composed of second metal wiring formed on the first metal wiring.

Also, a preferable mode is one wherein all of the main bit line and the first/second main source lines are composed of metal wiring while all of the first/second sub-source lines and the first/second sub-bit lines are composed of diffused wiring.

Furthermore, a preferable mode is one wherein a plurality of unit assemblies is disposed in a mirror-image manner in upward and downward as well as right and left places.

BRIEF DESCRIPTION OF THE DRAWING

The above and other objects, advantages and features of the present invention will be more apparent from the following description taken in conjunction with the accompanying drawings, in which.

DETAILED DESCRIPTION OF THE PREFERRED EMBODIMENT

Best modes of carrying out the present invention will be described in further detail using various embodiments with reference to the accompanying drawings.

Figure 1:
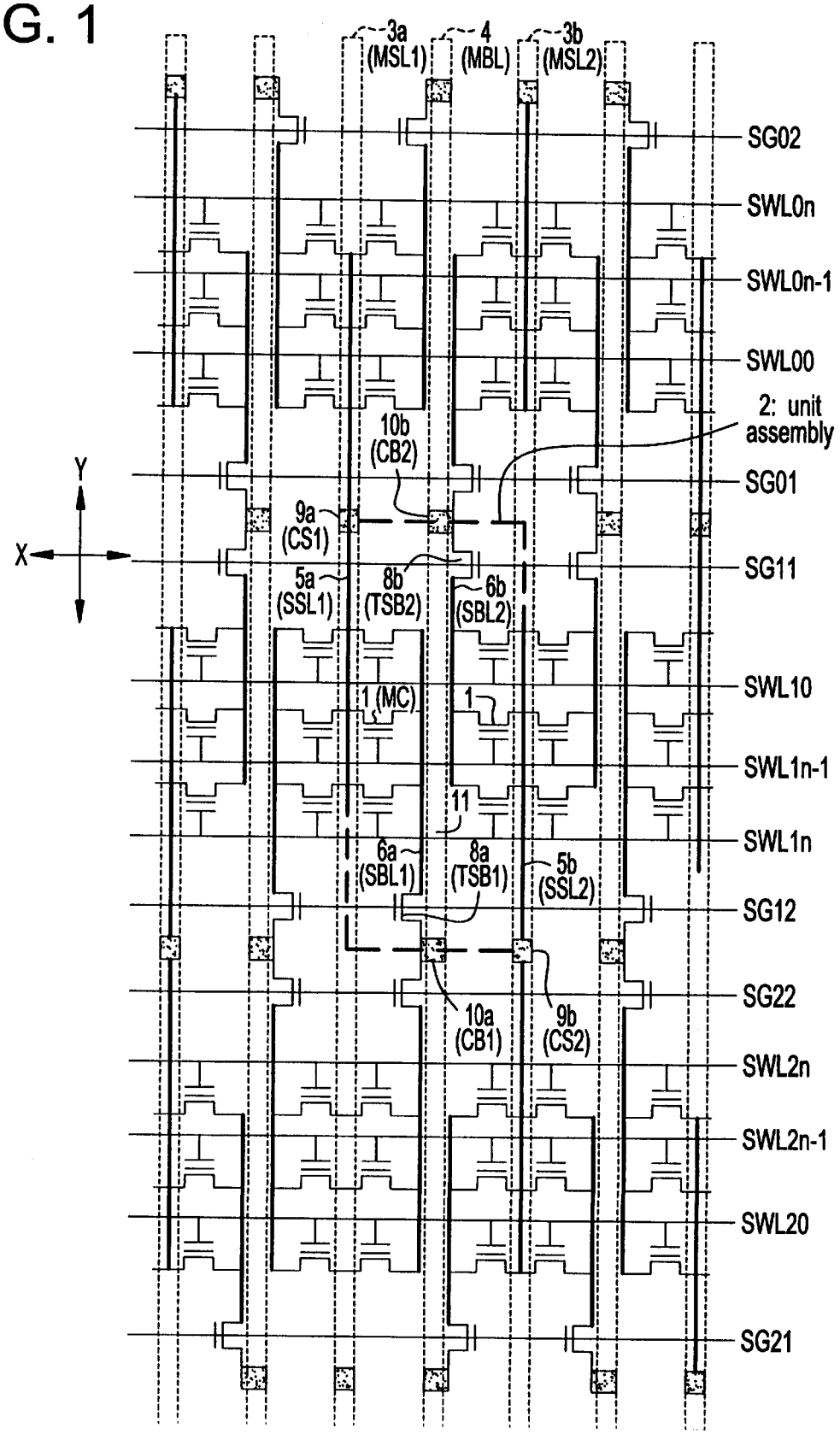
FIG. 1 is a top view showing an approximate layout of semiconductor device according to one embodiment of the present invention.

FIG. 1 is a top view showing an approximate layout of a semiconductor device according to one embodiment of the present invention. The semiconductor memory device is provided with more than one unit assembly 2 having two or more memory cells (MC) 1 surrounded by a broken line in the drawing and disposed in a matrix-like manner in the directions of a word line (X) and a bit line (Y). The memory cell has a MIS-type structure provided with a floating gate and a control gate. The reference number 3a (MSL1) is a first main source line, 3b (MSL2) being a second main source line, 4 (MBL) being a common main bit line, 5a (SSL1) being a first sub-source line, 5b (SSL2) being a second sub-source line, 6a (SBL1) being a first sub-bit line, 6b (SBL2) being a second sub-bit line, 8a (TSB1) being a first bit select transistor, 8b (TSB2) being a second bit select transistor, 9a (CS1) being a first source contact, 9a (CS2) being a second source contact, 10a (CB1) being a first it contact and 10a (CB2) being a second bit contact.

The common main bit line 4 and the first and second main source lines 3a and 3b disposed respectively on both sides of the main it line are all composed of metal wiring such as aluminum. The first and second sub-source line 5a and 5b, and first and second sub-bit line 6a and 6b are composed of diffused layers formed on a semiconductor substrate. The first and second bit select transistors 8a and 8b are ordinarily composed of the MIS-type transistors. The first and second bit contact 10a and 10b are formed in a contact hole being opened through an insulating film, which serve to contact the metal wiring to the diffused layer. As described later, in this embodiment, the conventionally employed first and second source select transistors are not used. The first and second bit select transistors 8a and 8b are adapted to independently control the first and second sub-bit lines 6a and 6b to write, delete and read information.

As depicted in FIG. 1, the unit assembly 2 is so configured that two groups of memory cells 1 consisting one group (first group) having two or more memory cells connected in parallel between the first sub-source line 5a and the first sub-bit line 6a and the other group (second group) having two or more memory cells connected in parallel between the second sub-source line 5b and the second sub-bit line 6b are disposed in a manner that an isolated area 11 are located between these two groups of memory cells.

The first sub-bit line 6a is elongated along the direction of the bit line (Y) and in one direction (in the downward direction in this embodiment) and is connected to the common main bit line 4 through the first bit select transistor 8a and further the first bit contact 10a.

On the other hand, the second sub-bit line 6b is elongated along the direction of the bit line and in the other direction (in the upward direction in this embodiment) and is also connected to the common main bit line 4 through the second bit select transistor 8b and further the second bit contact 10b.

That is, in this embodiment, the unit assembly is so configured that each of the first and second sub-bit lines 6a and 6b is elongated along the direction of the bit line (Y) and in the reverse direction and is connected to the common main bit line 4 through the first and second select transistors 8a and 8b each being independently controllable. This allows deviated disposition of the first and second bit select transistors 8a and 8b to avoid their adjacent disposition with respect to the direction of the bit line (Y), thus providing sufficient space to form these transistors 8a and 8b therein.

Moreover, the deviated disposition of the first and second bit select transistors 8a and 8b provides sufficient space to form the first and second bit contacts 10a and 10b, making it possible to mount only one common main bit line 4 on which the first and second bit contacts 10a and 10b can be formed accordingly.

As a result, there is no need to mount the source select transistors for each of the first and second sub-source lines 5a and 5b and these sub-source lines are directly connected to the first and second main source lines 3a and 3b through the first and second source contacts 9a and 9b.

If the use of the source select transistors is not required, there is no need to independently control the first and second sub-source lines 5a and 5b for writing, deleting and reading of information and this can be achieved, as described later and shown in FIG. 5, by supplying a negative voltage to a control gate of the select transistor and a ground voltage (0 volts) to a control gate of the non-select transistor at the time of writing.

Furthermore, the first and second source contacts 9a and 9b are disposed, centering on the main bit line 4, in a directly opposite position to each other.

Figure 4:
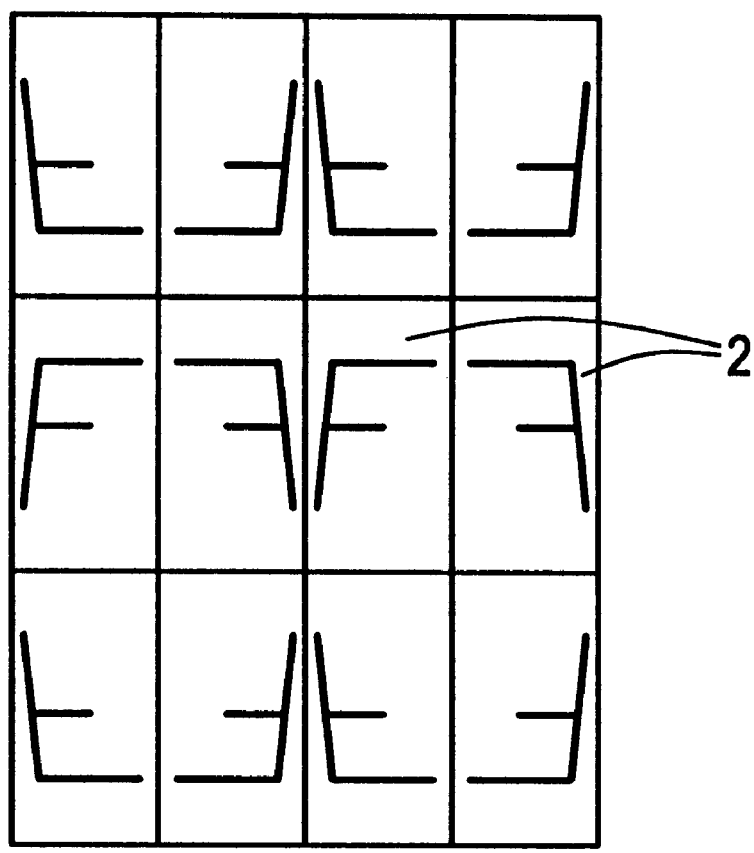
FIG. 4 is a diagrammatic view of more than one unit assembly constituting the semiconductor device disposed in a mirror-image manner in the upward/downward and right/left places.

A plurality of unit assemblies 2 is disposed in a mirror-image manner in upward and downward as well as right and left places. FIG. 4 shows an example of one memory array in which twelve unit assemblies 2 are disposed in a mirror-image manner.

As described above, by elongating each of the first and second sub-bit lines 6a and 6b along the direction of the bit line (Y) and in the reverse direction and by connecting these sub-bit lines to the common main bit line 4 through the first and second bit select transistors 8a and 8b each being independently controllable, the first and second bit select transistors 8a and 8b can be disposed in a deviated state without being adjacent to each other with respect to the direction of the bit line (Y), thus providing sufficient space to form the transistors 8a and 8b therein.

Also, the purpose can be accomplished by the use of only one common main bit line 4, which can provide sufficient space for a pitch of wiring.

As a result, when all the wiring pitches are provided in accordance with the minimum design standard F, unlike in the case of conventional configurations, only one bit select transistor disposed within an area 6F can be enough to allow the use of the bit select transistor being larger in size and the improvement of driving capability of the same.

Figure 2:
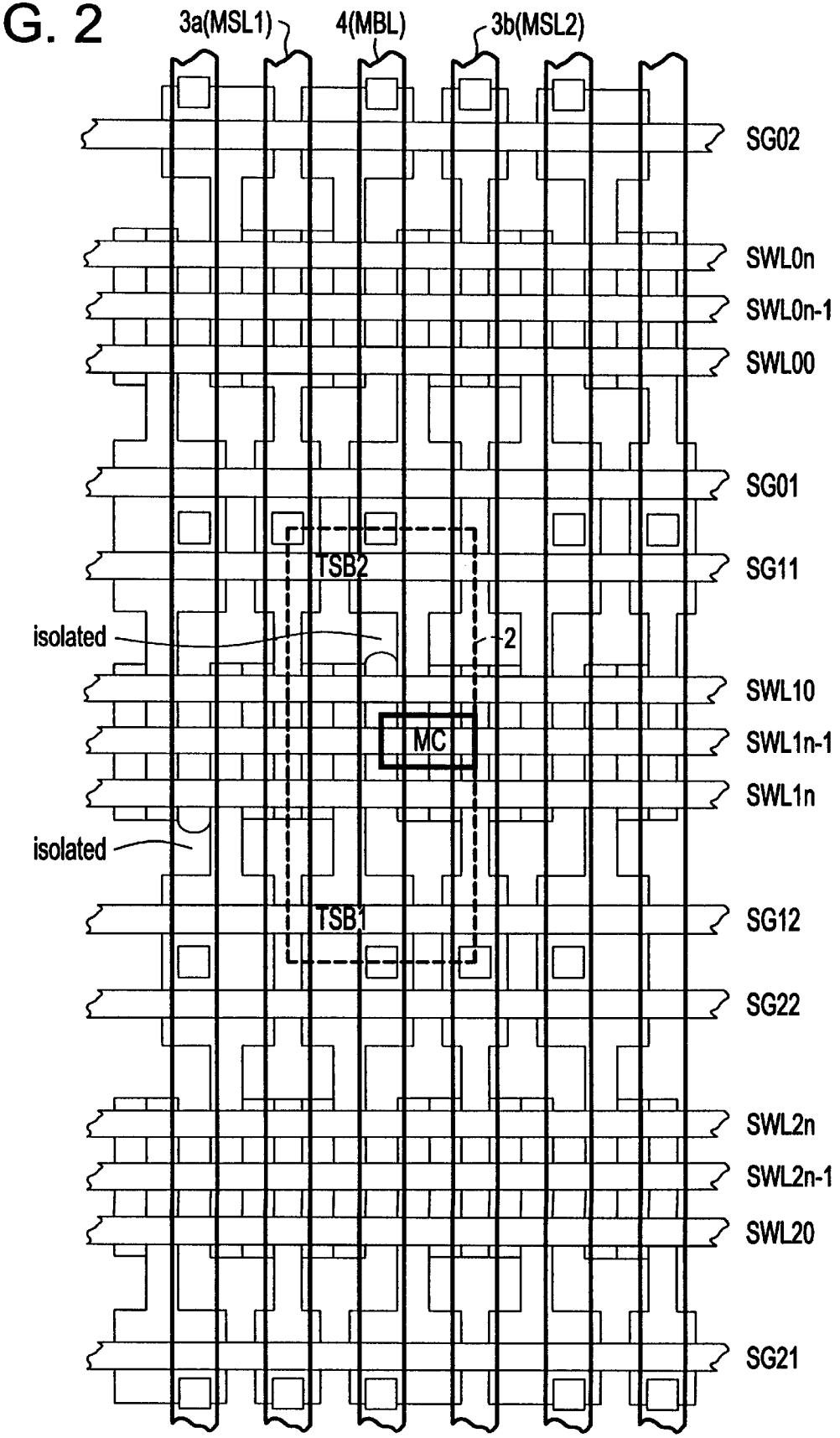
FIG. 2 is a top view illustrating a wiring pattern of the semiconductor memory device.

FIG. 2 shows an example of a wiring pattern of the semiconductor memory device according to this embodiment, consisting of first metal wiring made of aluminum, including a main bit line 4 and first and second main source lines 3a and 3b disposed respectively on both sides of the main bit line 4, all of which are formed simultaneously.

Figure 3:
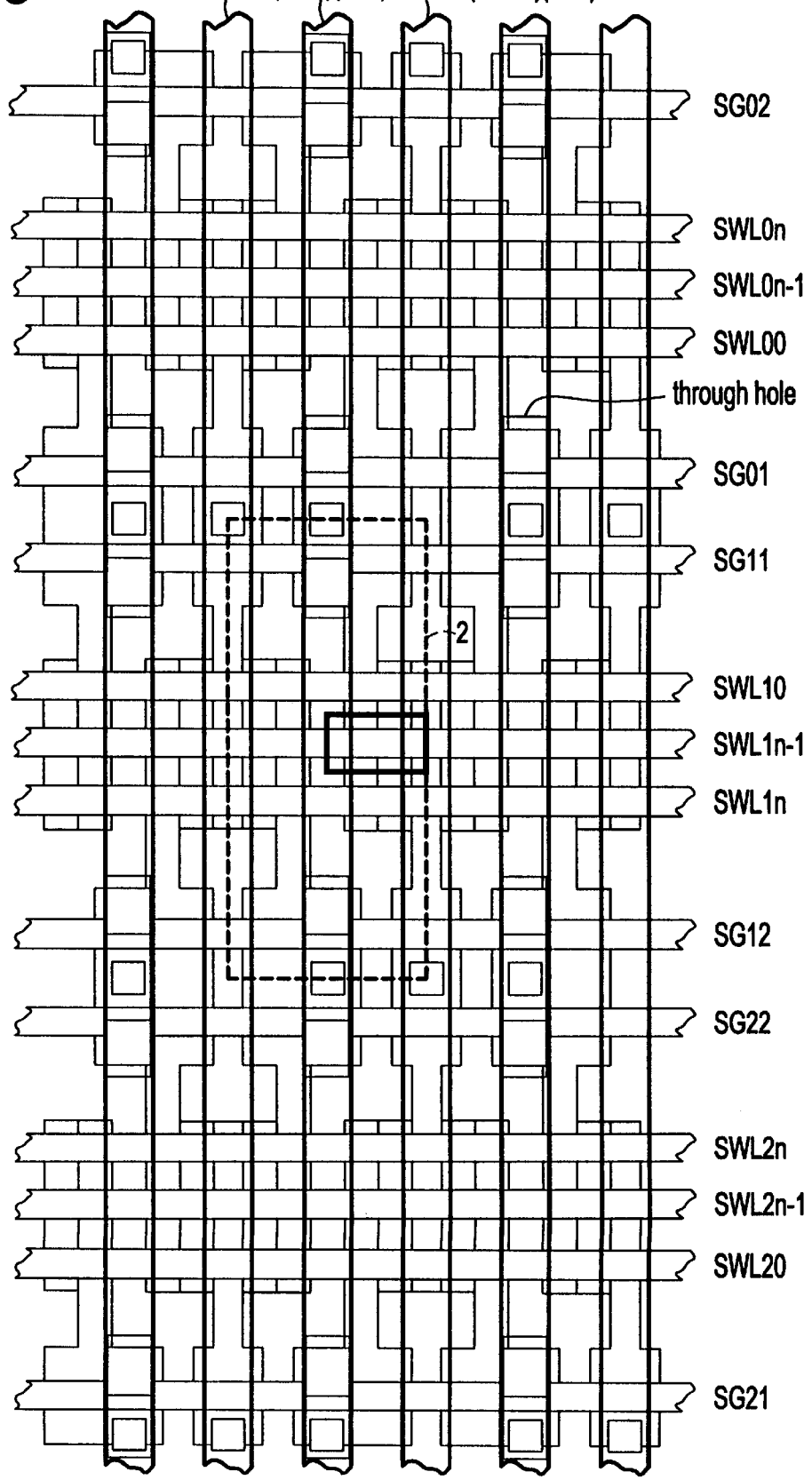
FIG. 3 is a top view illustrating another example of the wiring pattern of the semiconductor device.

FIG. 3 shows another example of a wiring pattern of the semiconductor memory device according to this embodiment, having first metal wiring made of aluminum, including first and second source lines 3a and 3b, both of which are formed simultaneously, and second metal wiring made of aluminum including a main bit line formed on the first metal wiring. By dividing the metal wiring into two layers, sufficient space can be provided for pitches of the wiring.

Figure 5:
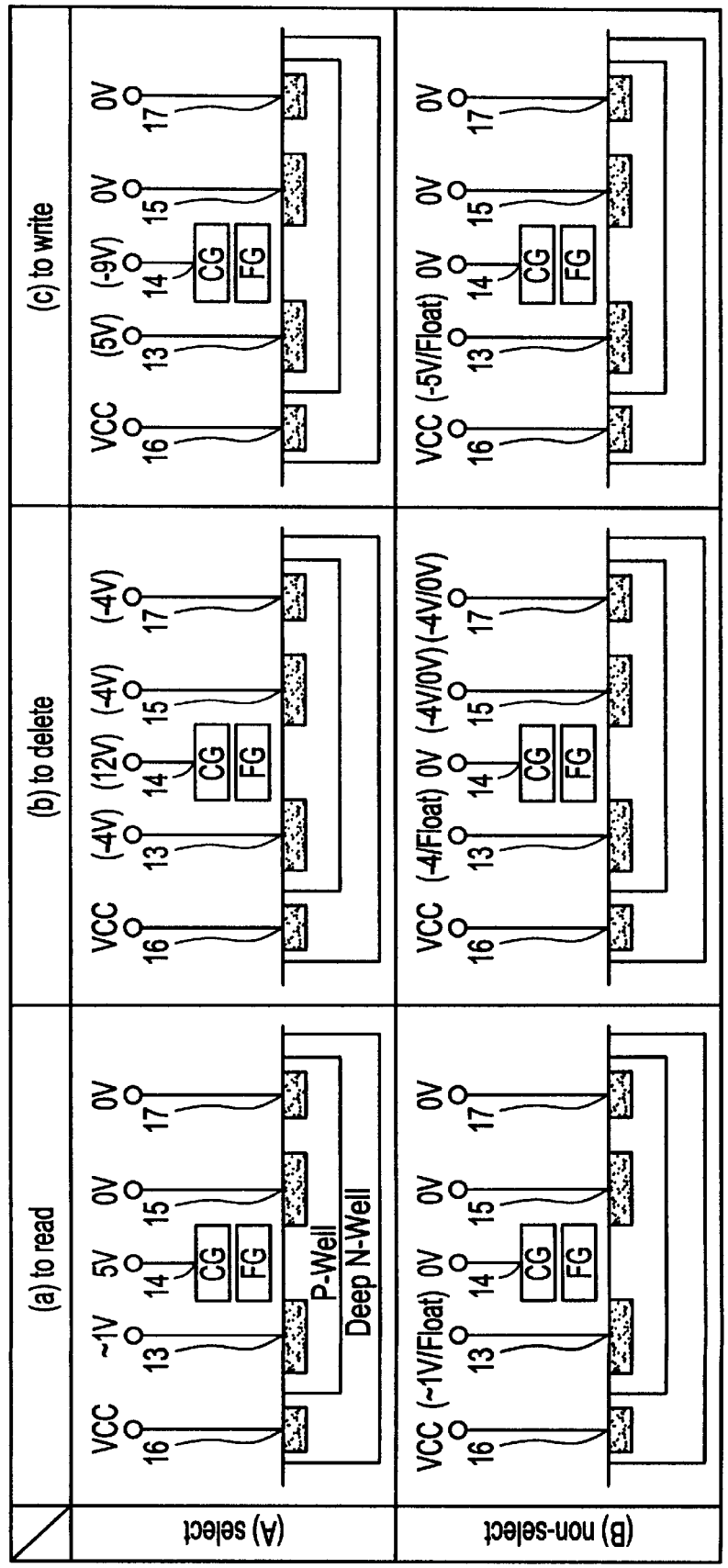
FIG. 5 is an explanatory drawing showing examples of conditions for voltages corresponding to operations of the semiconductor memory device according to this embodiment.
Figure 6:
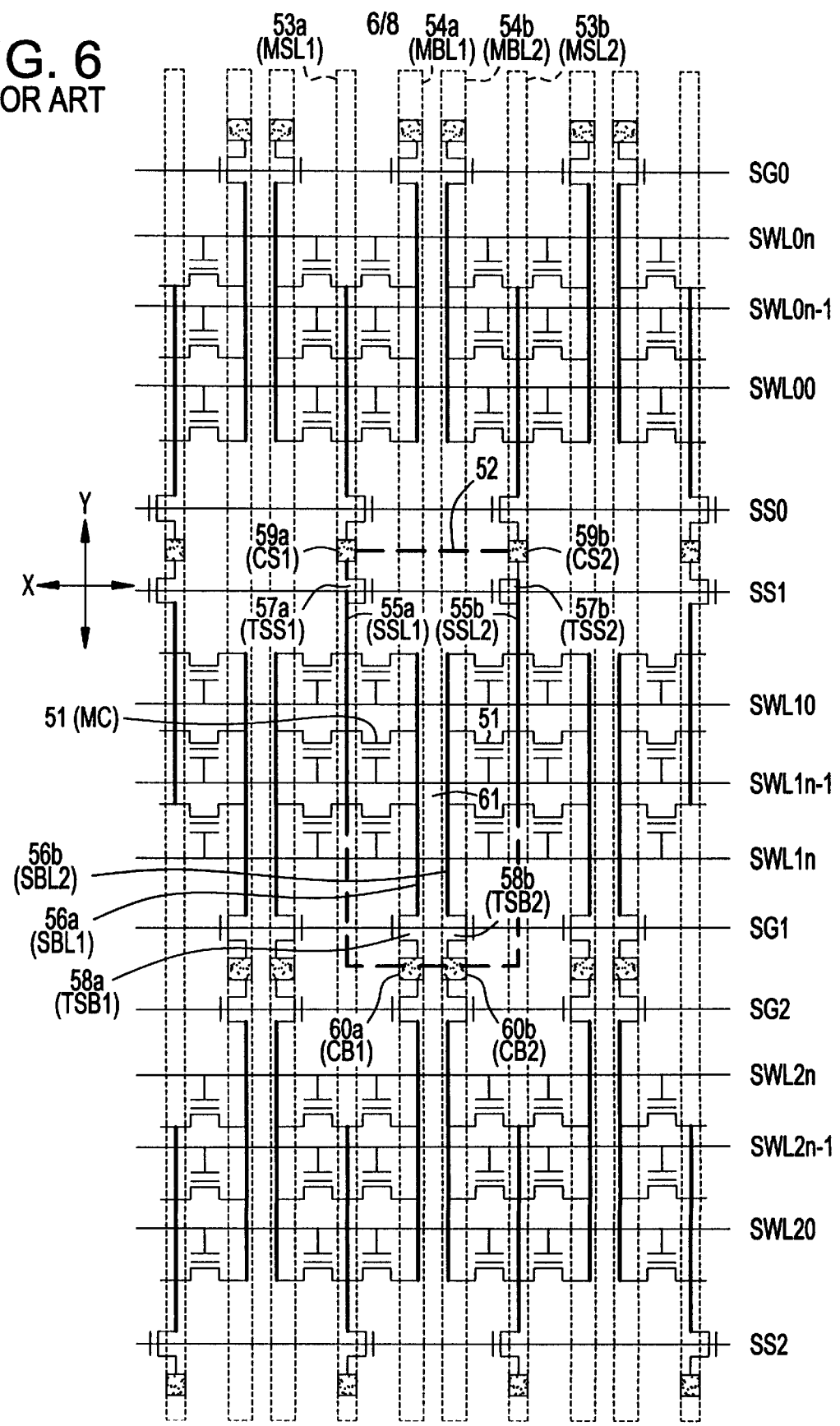
FIG. 6 is a top view showing one example of an approximate layout of a conventional semiconductor memory device.
Figure 7:
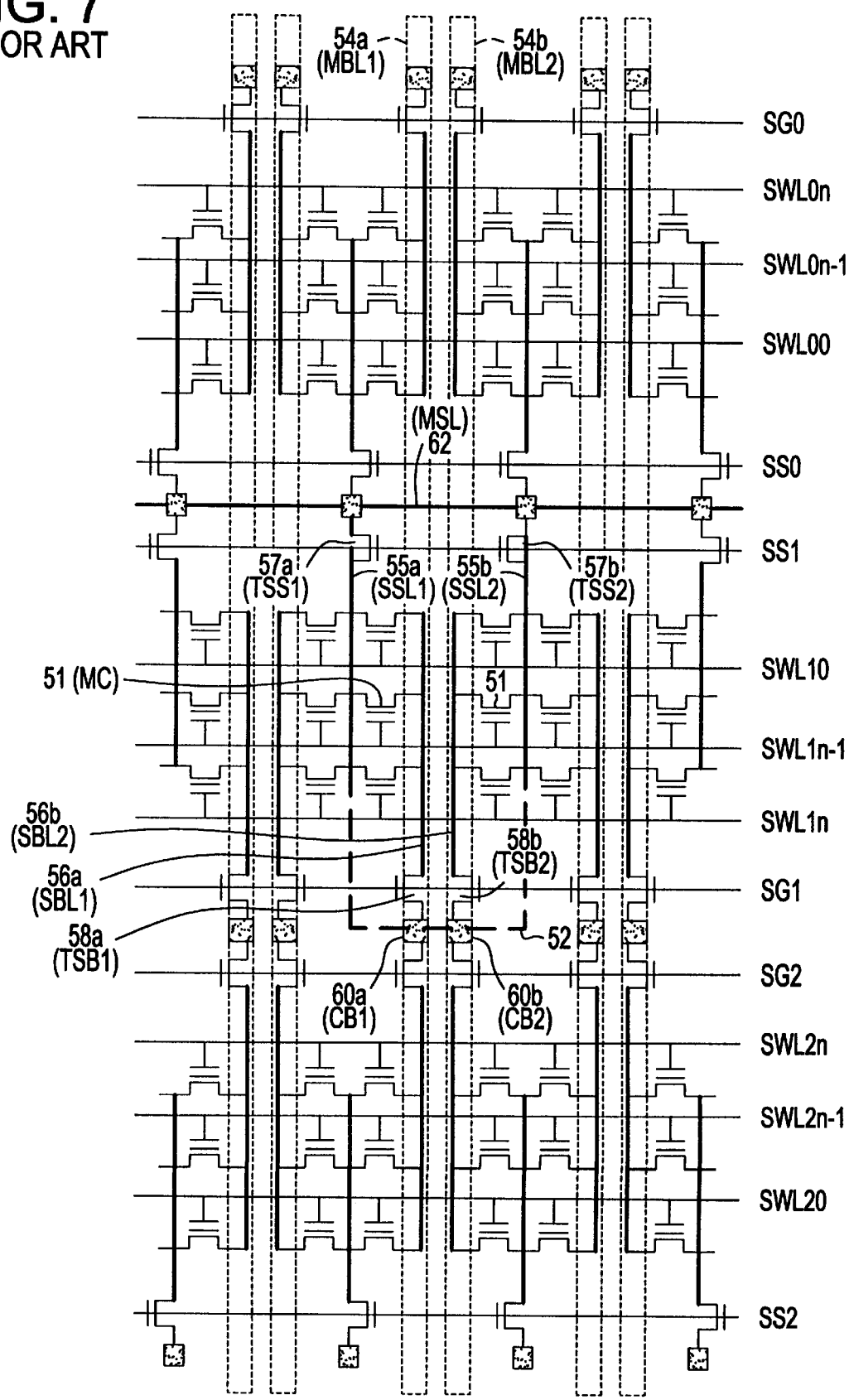
FIG. 7 is a top view showing another example of an approximate layout of a conventional semiconductor memory device.
Figure 8:
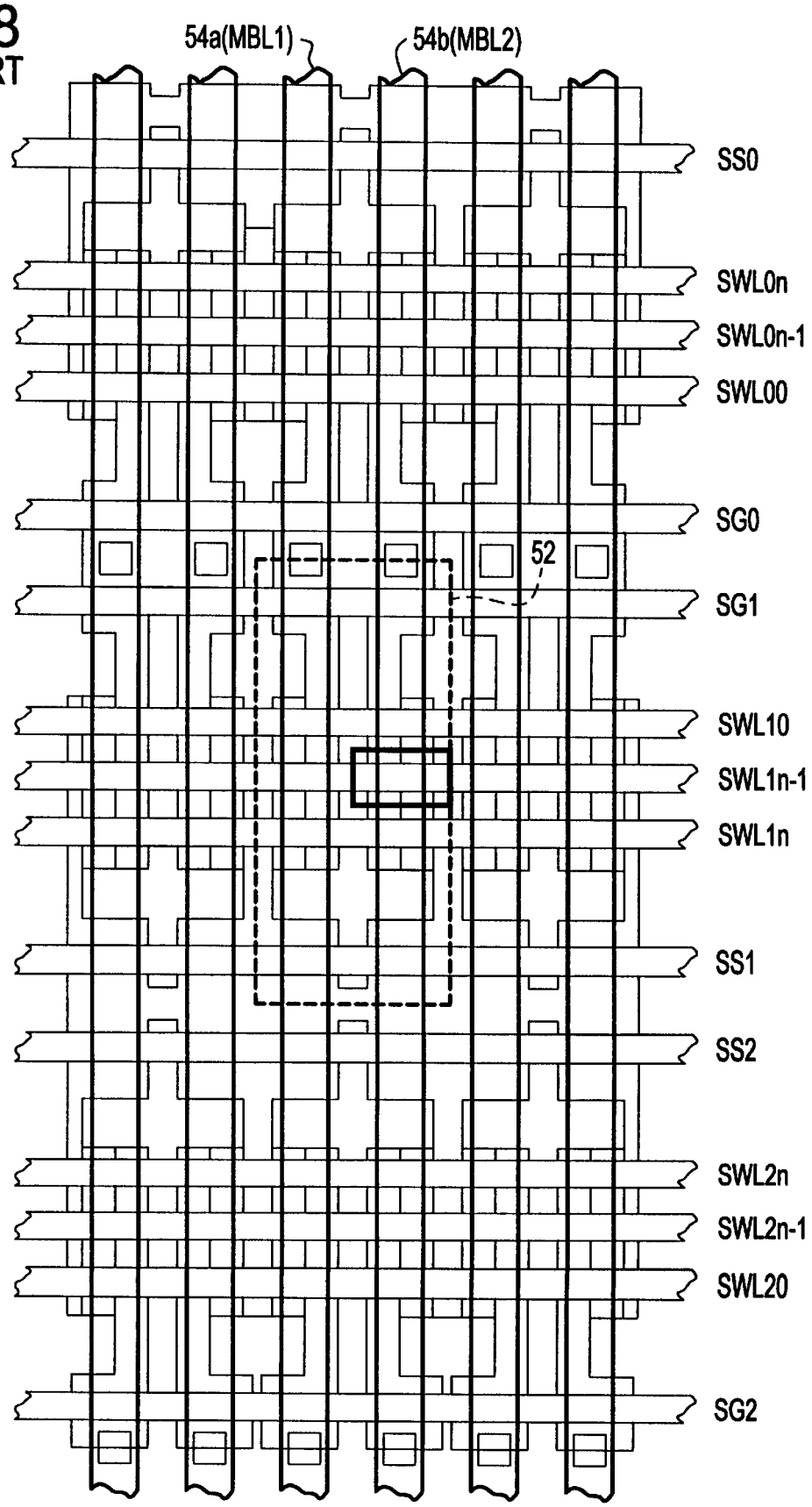
FIG. 8 is a top view showing a wiring pattern of the semiconductor memory device.

FIG. 5 illustrates examples of conditions for voltages corresponding to operations of the semiconductor memory device according to this embodiment. An N-channel semiconductor memory device is used in this example in FIG. 5. The reference number 13 is a source electrode, 14 being a control gate electrode, 15 being a drain electrode, 16 being an electrode for an N-well and 17 being an electrode for a P-well. The voltage shown in FIG. 5 is adapted to be supplied to each electrode (a) to read, (b) to delete and (c)

to write information while the semiconductor memory device is selected (A) or not selected (B).

Thus, in the configuration according to this embodiment, each of the first and second sub-bit lines 6a and 6b is elongated along the direction of the bit line (Y) and in the reverse direction and is connected to the common main bit line 4 through the first and second bit select transistors 8a and 8b each being independently controllable, allowing deviated disposition of the first and second bit select transistors 8a and 8b to avoid the disposition adjacent to each other with respect to the direction of the bit line (Y) and to allow these transistors to become larger in size.

Accordingly, the improvement of driving capability of the bit select transistors can be achieved without increasing the memory cell array in size.

Moreover, the purpose can be accomplished by the use of only one common main bit line 4, which can provide sufficient space for a pitch of wiring.

It is apparent that the present invention is not limited to the above embodiment but may be changed and modified without departing from the scope and spirit of the invention. For example, the number of memory cells and of the group of memory cells constituting the unit assembly may be changed if necessary.

Additionally, the positions of the first and second bit select transistors connected to the first and second sub-bit lines disposed in a manner that the isolated area is located between these sub-bit lines, if they are deviated to the extent that both transistors are not disposed adjacent to each other, are not necessarily disposed at the end of the array in the direction of the bit line. Furthermore, the metal wiring constituting the main source line or main bit line may be stacked so that three or more layers are formed. The conduction-type of a channel area constituting the semiconductor device may be either a P-channel or N-channel.

As described above, the semiconductor memory device of the present invention is so configured that each of the first and second bit lines is elongated along the direction of the bit line and in the reverse direction and is connected to the common main bit line through the first and second bit select transistors each being independently controllable and, as a result, the first and second bit select transistors can be disposed in a deviated state without being adjacent to each other with respect to the direction of the bit line, thus allowing the first and second bit select transistors to increase in size.

Accordingly, the improvement of driving capability of the bit select transistors can be achieved without increasing the memory cell array in size. Moreover, the purpose can be accomplished by the use of only one common main bit line 4, which can provide sufficient space for a pitch of wiring.

Finally, the present application claims the priority of Japanese Patent Application No. Hei10-232156 filed on Aug. 18, 1998, which is herein incorporated by reference.

What is claimed is:

1. A semiconductor memory device comprising more than one unit assembly wherein first and second main source lines are disposed respectively on both sides of a main bit line and first and second sub-source lines connected respectively to said first and second main source lines and first and second sub-bit lines connected to said main bit line are provided and wherein two groups of memory cells consisting one group having two or more memory cells connected in parallel between said first sub-source line and said first sub-bit line and the other group having two or more memory cells connected in parallel between said second sub-source line and said second sub-bit line are disposed in a manner that an isolated area is located between these two groups of memory cells, whereby each of said first and second bit lines is elongated along the direction of the bit line and in the reverse direction and is connected to said main bit line through first and second bit select transistors each being independently controllable.

2. The semiconductor memory device according to claim 1 wherein said first and second sub-bit lines are connected to said main bit line through first and second bit contacts connected respectively to said first and second bit select transistors.

3. The semiconductor memory device according to claim 1 wherein said first and second sub-source lines are connected directly, without using source select transistors, to said first and second main source lines.

4. The semiconductor memory device according to claim 3 wherein said first and second source lines are connected respectively to said first and second main source lines through first and second source contacts disposed, centering on said main bit line, in a directly opposite position to each other in each unit assembly.

5. The semiconductor memory device according to any one of claims 1 to 4 wherein both said main bit line and said first and second main source lines are composed of a first metal wiring formed simultaneously.

6. The semiconductor memory device according to any one of claims 1 to 4 wherein said first and second source lines are composed of said first metal wiring formed simultaneously while said main bit line is composed of second metal wiring formed on said first metal wiring.

7. The semiconductor memory device according to any one of claims 1 to 4 wherein all of said main bit line and said first/second main source lines are composed of metal wiring while all of said first/second sub-source lines and said first/second sub-bit lines are composed of diffused wiring.

8. The semiconductor memory device according to any one of claims 1 to 4 wherein a plurality of unit assemblies is disposed in a mirror-image manner in upward and downward as well as right and left places.

9. The semiconductor memory device according to claim 2 wherein said first and second sub-source lines are connected directly, without using source select transistors, to said first and second main source lines.

10. The semiconductor memory device according to claim 9 wherein said first and second source lines are connected respectively to said first and second main source lines through first and second source contacts disposed, centering on said main bit line, in a directly opposite position to each other in each unit assembly.

11. The semiconductor memory device according to either claim 9 or 10 wherein both said main bit line and said first and second main source lines are composed of a first metal wiring formed simultaneously.

12. The semiconductor memory device according to either claim 9 or 10 wherein said first and second source lines are composed of said first metal wiring formed simultaneously while said main bit line is composed of second metal wiring formed on said first metal wiring.

13. The semiconductor memory device according to either claim 9 or 10 wherein all of said main bit line and said first/second main source lines are composed of metal wiring while all of said first/second sub-source lines and said first/second sub-bit lines are composed of diffused wiring.

14. The semiconductor memory device according to either claim 9 or 10 wherein a plurality of unit assemblies is disposed in a mirror-image manner in upward and downward as well as right and left places.

* * * * *